United States Patent
Takenaka et al.

(10) Patent No.: US 10,797,657 B2
(45) Date of Patent: Oct. 6, 2020

(54) MATCHING NETWORK AND POWER AMPLIFIER CIRCUIT

(71) Applicant: Murata Manufacturing Co., Ltd., Kyoto (JP)

(72) Inventors: Kiichiro Takenaka, Kyoto (JP); Masahiro Ito, Kyoto (JP); Tsuyoshi Sato, Kyoto (JP); Kozo Sato, Kyoto (JP); Hidetoshi Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 6 days.

(21) Appl. No.: 16/217,506

(22) Filed: Dec. 12, 2018

(65) Prior Publication Data
US 2019/0199298 A1 Jun. 27, 2019

(30) Foreign Application Priority Data

Dec. 27, 2017 (JP) .................................. 2017-252513

(51) Int. Cl.
*H03F 1/56* (2006.01)
*H03F 3/195* (2006.01)
(Continued)

(52) U.S. Cl.
CPC ............. *H03F 1/565* (2013.01); *H03F 3/195* (2013.01); *H03F 3/211* (2013.01); *H03F 3/45085* (2013.01); *H03F 3/45183* (2013.01); *H03H 7/09* (2013.01); *H03H 7/1758* (2013.01); *H03H 7/38* (2013.01); *H03F 2200/171* (2013.01); *H03F 2200/222* (2013.01);
(Continued)

(58) Field of Classification Search
CPC . H03F 3/45; H03F 3/191; H03F 3/193; H03F 2200/09; H03F 2200/541; H03F 1/56; H03F 1/565
USPC .................. 330/195, 302, 306, 69, 252, 276
See application file for complete search history.

(56) References Cited

U.S. PATENT DOCUMENTS 8,098,095 B2 * 1/2012 Nam .......................... H03F 3/68
330/195
9,584,076 B2 2/2017 Ortiz
(Continued)

FOREIGN PATENT DOCUMENTS

| JP | 2006054914 A | 2/2006 |
|---|---|---|
| JP | 2013-135304 A | 7/2013 |
| WO | 2016/030942 A1 | 3/2016 |

*Primary Examiner* — Steven J Mottola
(74) *Attorney, Agent, or Firm* — Pearne & Gordon LLP

(57) ABSTRACT

A matching network is a matching network of a power amplifier circuit that outputs a signal obtained by a differential amplifier amplifying power of a high-frequency signal. The matching network includes an input-side winding connected between differential outputs of the differential amplifier; an output-side winding that is coupled to the input-side winding via an electromagnetic field and whose one end is connected to a reference potential; a first LC series resonant circuit including a capacitive element and an inductive element connected in series with each other, and being connected in parallel with the input-side winding; and a second LC series resonant circuit including a capacitive element and an inductive element connected in series with each other, and being connected in parallel with the output-side winding.

19 Claims, 11 Drawing Sheets

(51) Int. Cl.
*H03F 3/45* (2006.01)
*H03H 7/38* (2006.01)
*H03F 3/21* (2006.01)
*H03H 7/09* (2006.01)
*H03H 7/01* (2006.01)

(52) U.S. Cl.
CPC .. *H03F 2200/387* (2013.01); *H03F 2200/451* (2013.01); *H03F 2203/21103* (2013.01); *H03F 2203/21139* (2013.01); *H03F 2203/45172* (2013.01); *H03F 2203/45576* (2013.01); *H03H 7/0115* (2013.01)

(56) References Cited

U.S. PATENT DOCUMENTS

2016/0065149 A1* 3/2016 Shaw ................ H03F 3/45179
  330/261
2017/0244442 A1 8/2017 Mizokami et al.

* cited by examiner

MATCHING NETWORK AND POWER AMPLIFIER CIRCUIT

This application claims priority from Japanese Patent Application No. 2017-252513 filed on Dec. 27, 2017. The content of this application is incorporated herein by reference in its entirety.

BACKGROUND

The present disclosure relates to a matching network and a power amplifier circuit. In recent years, in radio communication systems in mobile communication terminal devices, such as, cellular phones and smartphones, modulation schemes, such as high speed uplink packet access (HSUPA) and long term evolution (LTE), have been adopted. In a fourth generation mobile communication system, multiband carrier waves are increasingly used, and the support for a plurality of frequency bands is demanded. Furthermore, to achieve high-speed data communication and stabilization of communication, a bandwidth is widened by carrier aggregation (CA). For this reason, in a power amplifier circuit at a stage previous to a front-end section as well, support for multiple bands and wider bandwidths is demanded.

U.S. Pat. No. 9,584,076 discloses a power amplifier module including a differential amplifier and a transformer for output matching. Such a configuration makes it possible to achieve output matching over a wide frequency band. Furthermore, for example, a decoupling capacitor between circuits is unnecessary, thereby enabling a reduction in the size or cost of the power amplifier module.

In a typical mobile communication terminal device, an amplifier element constituting a power amplifier circuit has nonlinear gain characteristics and nonlinear phase characteristics to cause distortion in a high-frequency signal, and outputs a signal containing a harmonic. Although, in the case where the power amplifier circuit includes a differential amplifier and a transformer, it is possible to achieve output matching over a wide frequency band as described above, a harmonic caused by the nonlinearity of the amplifier element tends to be output.

BRIEF SUMMARY

In view of the above, the present disclosure has been made to make it possible to suppress a harmonic output from a power amplifier circuit.

A matching network according to one embodiment of the present disclosure is a matching network of a power amplifier circuit to which a high-frequency signal is input from an input node and that outputs, to an output node, a signal obtained by a differential amplifier amplifying power of the high-frequency signal. The matching network includes a transformer including an input-side winding connected between differential outputs of the differential amplifier, and an output-side winding that is coupled to the input-side winding via an electromagnetic field and whose one end is connected to a reference potential; a first LC series resonant circuit including a capacitive element and an inductive element connected in series with each other, and being connected in parallel with the input-side winding; and a second LC series resonant circuit including a capacitive element and an inductive element connected in series with each other, and being connected in parallel with the output-side winding.

In this configuration, resonant frequencies of the first LC series resonant circuit and the second LC series resonant circuit are caused to coincide with the frequency of any harmonic of a plurality of harmonics, and thus the matching network can effectively suppress a harmonic output from the power amplifier circuit.

Other features, elements, characteristics and advantages of the present disclosure will become more apparent from the following detailed description of embodiments of the present disclosure with reference to the attached drawings.

DETAILED DESCRIPTION

A matching network and a power amplifier circuit according to embodiments will be described in detail below with reference to the drawings. Note that the present disclosure is not to be limited by these embodiments. The embodiments are merely illustrative, and it goes without necessarily saying that configurations described in different embodiments can be partially replaced or combined. In second and subsequent embodiments, descriptions of things in common with a first embodiment are omitted, and only respects in which the second and subsequent embodiments differ from the first embodiment will be described. In particular, similar operation and effects based on similar configurations are not referred to for each embodiment.

First Embodiment

Figure 1:
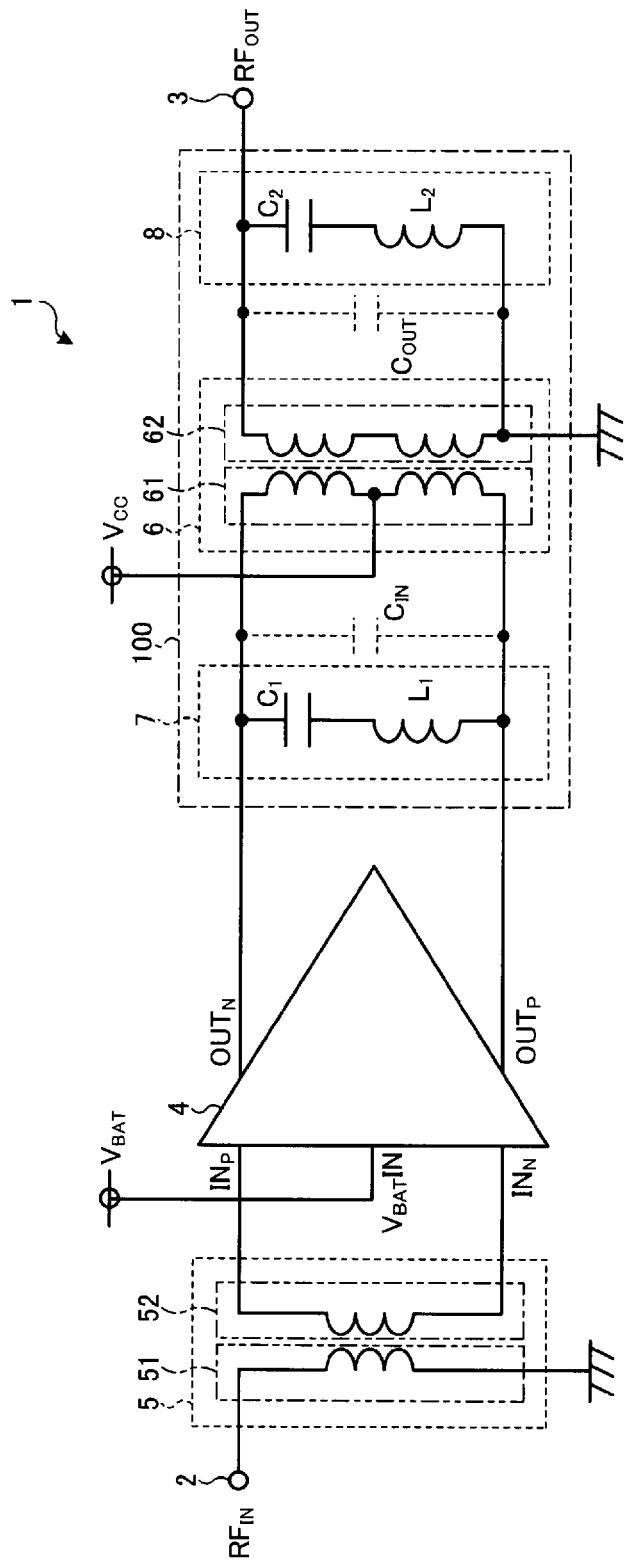
FIG. 1 illustrates an example of a configuration of a power amplifier circuit according to a first embodiment.

FIG. 1 illustrates an example of a configuration of a power amplifier circuit according to the first embodiment. A power amplifier circuit 1 can be used in a mobile communication terminal device, such as a cellular phone or smartphone, to transmit various signals, such as voice and data, to a base station.

The power amplifier circuit 1 amplifies an input signal $RF_{IN}$, which is a high-frequency signal, input from a previous-stage circuit to an input node 2. Subsequently, the power amplifier circuit 1 outputs an output signal $RF_{OUT}$, which is the amplified high-frequency signal, from an output node 3 to a subsequent-stage circuit. Although an example of the previous-stage circuit is a transmission power control circuit that adjusts the power of a modulated signal, the previous-stage circuit is not limited to this. Although an example of the subsequent-stage circuit is a front-end circuit that performs, for example, filtering on the output signal $RF_{OUT}$ to transmit the output signal $RF_{OUT}$ subjected to filtering to an antenna, the subsequent-stage circuit is not limited to this. Although an example of the frequency of a fundamental (carrier wave) of a high-frequency signal ranges from about several hundred MHz to about several GHz, the frequency is not limited to the range.

As illustrated in FIG. 1, the power amplifier circuit 1 includes a differential amplifier 4, a first transformer 5, a second transformer 6, a first LC series resonant circuit 7, and a second LC series resonant circuit 8.

The first transformer 5 constitutes an input matching network between an output of the previous-stage circuit previous to the power amplifier circuit 1 and an input of the power amplifier circuit 1.

The first transformer 5 includes an input-side winding 51 and an output-side winding 52.

One end of the input-side winding 51 is connected to a reference potential. The other end of the input-side winding 51 is connected to the input node 2. Although the reference potential herein is a ground potential, the reference potential is not limited to this.

The output-side winding 52 is connected between an input $IN_P$ and an input $IN_N$ of the differential amplifier 4.

The input-side winding 51 and the output-side winding 52 are coupled via an electromagnetic field. Thus, the input signal $RF_{IN}$ input from the input node 2 to the other end of the input-side winding 51 is converted into a differential signal by the first transformer 5 and is output to the differential amplifier 4.

The second transformer 6 constitutes a matching network (output matching network) 100 between an output of the power amplifier circuit 1 and an input of the subsequent-stage circuit subsequent to the power amplifier circuit 1.

The second transformer 6 includes an input-side winding 61 and an output-side winding 62.

The input-side winding 61 is connected between an output $OUT_N$ and an output $OUT_P$ of the differential amplifier 4. A power-supply potential $V_{CC}$ is connected to a midpoint of the input-side winding 61. Furthermore, a capacitor $C_{IN}$ is connected in parallel with the input-side winding 61.

One end of the output-side winding 62 is connected to the reference potential. The other end of the output-side winding 62 is connected to the output node 3. Furthermore, a capacitor $C_{OUT}$ is connected in parallel with the output-side winding 62.

The input-side winding 61 and the output-side winding 62 are coupled via an electromagnetic field. Thus, the differential signal output from the differential amplifier 4 is converted into the output signal $RF_{OUT}$ by the second transformer 6 and is output from the output node 3.

The first LC series resonant circuit 7 includes a capacitor $C_1$ serving as a capacitive element, and an inductor $L_1$ serving as an inductive element.

The first LC series resonant circuit 7 is constituted by the capacitor $C_1$ and the inductor $L_1$ that are connected in series with each other. Furthermore, the first LC series resonant circuit 7 is connected in parallel with the input-side winding 61 of the second transformer 6.

The second LC series resonant circuit 8 includes a capacitor $C_2$ serving as a capacitive element, and an inductor $L_2$ serving as an inductive element.

The second LC series resonant circuit 8 is constituted by the capacitor $C_2$ and the inductor $L_2$ that are connected in series with each other. Furthermore, the second LC series resonant circuit 8 is connected in parallel with the output-side winding 62 of the second transformer 6.

In the power amplifier circuit 1 according to the first embodiment, the first LC series resonant circuit 7, the second LC series resonant circuit 8, and the input-side winding 61 and the output-side winding 62 of the second transformer 6 operate as the matching network 100.

Figure 2:
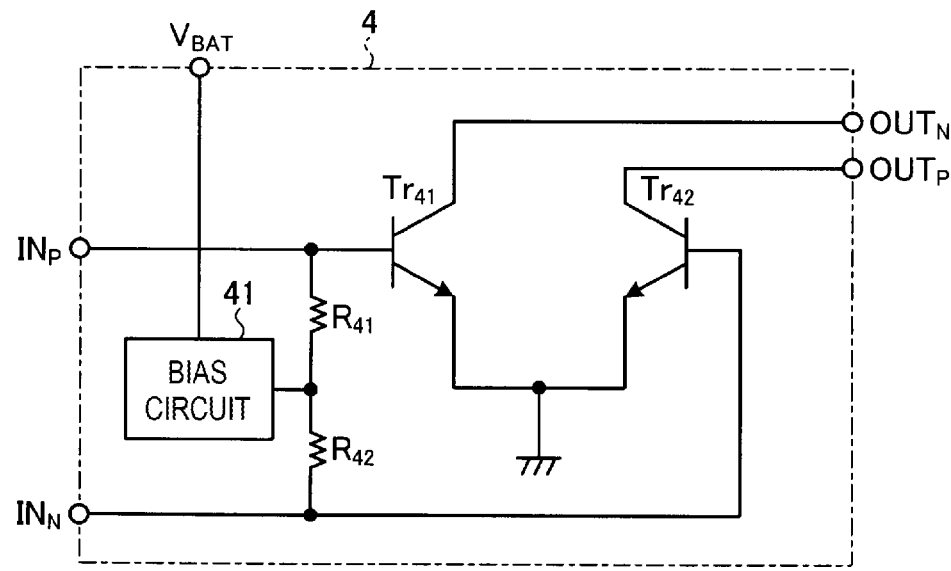
FIG. 2 illustrates an example of a schematic configuration of a differential amplifier.
Figure 3:
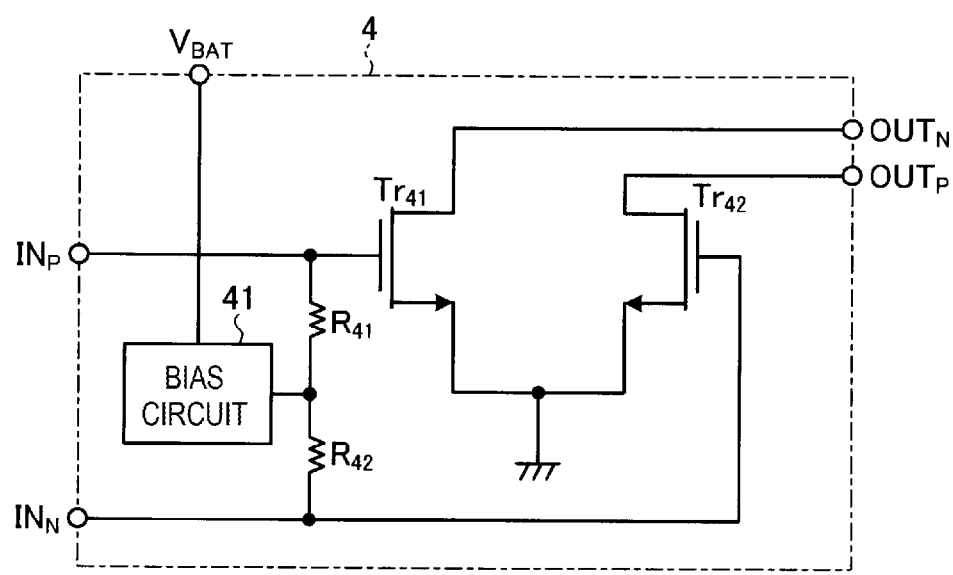
FIG. 3 illustrates another example of the schematic configuration of the differential amplifier.

Here, a configuration of the differential amplifier 4 will be described. FIG. 2 illustrates an example of a schematic configuration of the differential amplifier. FIG. 3 illustrates another example of the schematic configuration of the differential amplifier.

As illustrated in FIGS. 2 and 3, the differential amplifier 4 includes a differential pair of transistors $Tr_{41}$ and $Tr_{42}$, resistors $R_{41}$ and $R_{42}$, and a bias circuit 41.

The transistors $Tr_{41}$ and $Tr_{42}$ may be, for example, bipolar transistors as illustrated in FIG. 2, or may be, for example, field-effect transistors (FETs) as illustrated in FIG. 3. In the case where the transistors $Tr_{41}$ and $Tr_{42}$ are constituted by bipolar transistors, heterojunction bipolar transistors (HBTs) are given as an example.

The bias circuit 41 is connected to a power-supply potential $V_{BAT}$. Although the configuration of the bias circuit 41 including, for example, a transistor for supply of bias current (not illustrated) and so forth is given as an example, the present disclosure is not limited by the configuration of the bias circuit 41. For example, in the examples illustrated in FIGS. 2 and 3, the configurations of the bias circuit 41 may differ from each other.

The case where the transistors $Tr_{41}$ and $Tr_{42}$ constituting the differential amplifier 4 are HBTs will be described with reference to FIG. 2.

Emitters of the transistors $Tr_{41}$ and $Tr_{42}$ are connected to the reference potential. A collector of the transistor $Tr_{41}$ is connected to the output $OUT_N$. A collector of the transistor $Tr_{42}$ is connected to the output $OUT_P$. The power-supply potential $V_{CC}$ is supplied to the collectors of the transistors $Tr_{41}$ and $Tr_{42}$ via the input-side winding 61 of the second transformer 6 (see FIG. 1).

A base of the transistor $Tr_{41}$ is connected to the input $IN_P$. The bias circuit 41 supplies a bias current to the base of the transistor $Tr_{41}$ via the resistor $R_{41}$. Furthermore, a base of the transistor $Tr_{42}$ is connected to the input $IN_N$. The bias circuit 41 supplies a bias current to the base of the transistor $Tr_{42}$ via the resistor $R_{42}$.

The case where the transistors $Tr_{41}$ and $Tr_{42}$ constituting the differential amplifier 4 are FETs will be described with reference to FIG. 3.

Sources of the transistors $Tr_{41}$ and $Tr_{42}$ are connected to the reference potential. A drain of the transistor $Tr_{41}$ is connected to the output $OUT_N$. A drain of the transistor $Tr_{42}$ is connected to the output $OUT_P$. The power-supply potential $V_{CC}$ is supplied to the drains of the transistors $Tr_{41}$ and $Tr_{42}$ via the input-side winding 61 of the second transformer 6 (see FIG. 1).

A gate of the transistor $Tr_{41}$ is connected to the input $IN_P$. The bias circuit 41 supplies a bias potential to the gate of the transistor $Tr_{41}$ via the resistor $R_{41}$. Furthermore, a gate of the transistor $Tr_{42}$ is connected to the input $IN_N$. The bias circuit 41 supplies a bias potential to the gate of the transistor $Tr_{42}$ via the resistor $R_{42}$.

Note that the transistors $Tr_{41}$ and $Tr_{42}$ constituting the differential amplifier 4 are not limited to the above-described HBTs or FETs.

Figure 4:
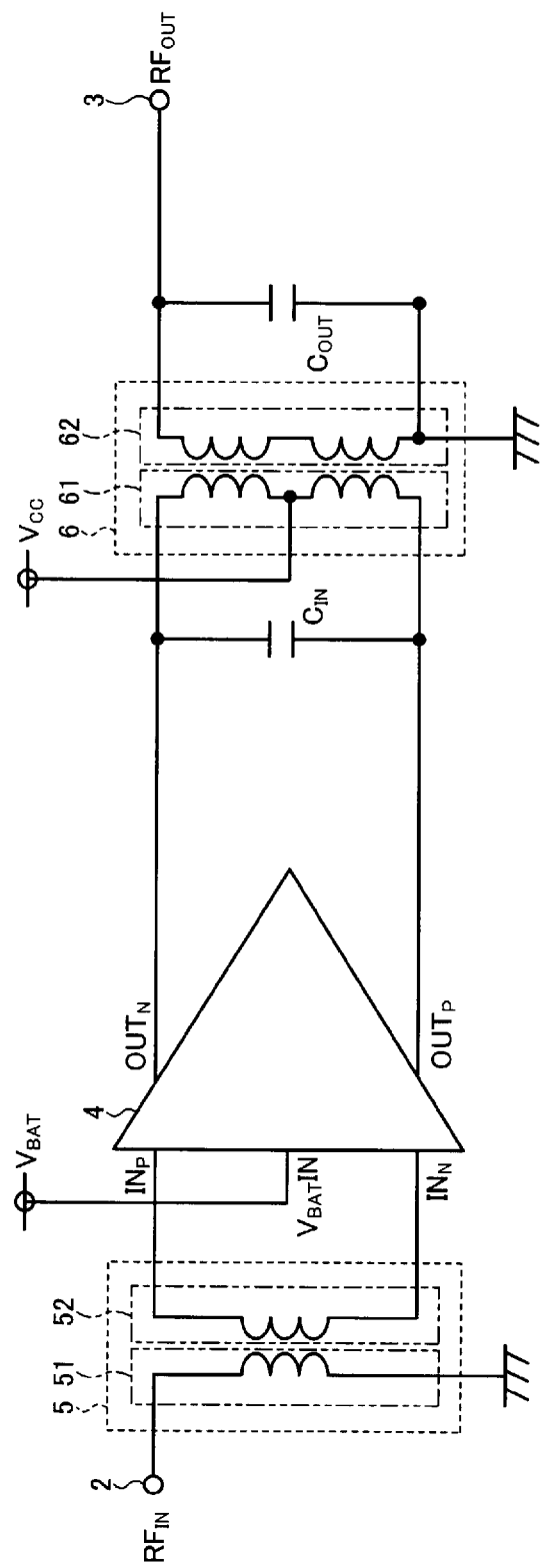
FIG. 4 illustrates an example of a configuration of a power amplifier circuit according to a comparative example.
Figure 5:
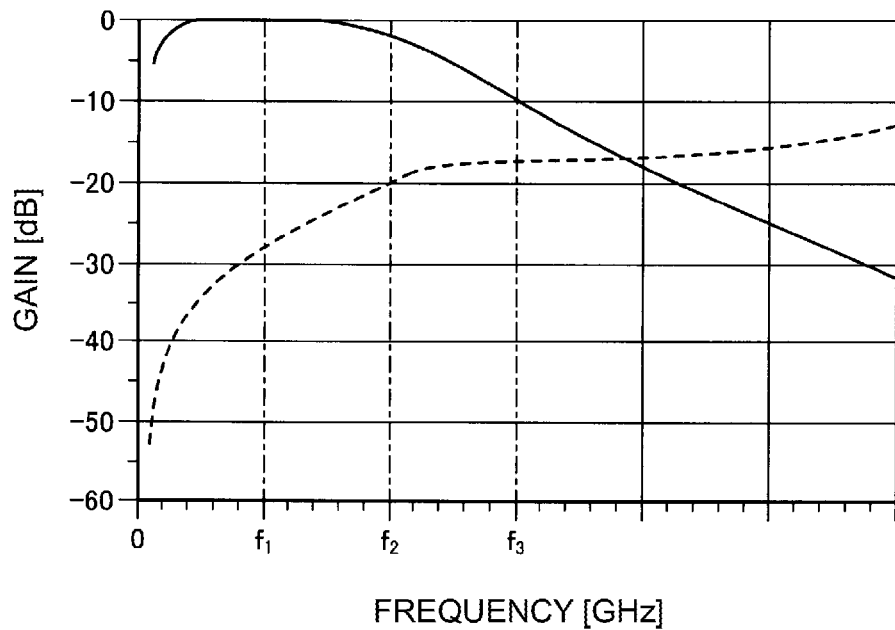
FIG. 5 illustrates an example of a bandpass characteristic in the comparative example illustrated in FIG. 4.
Figure 6:
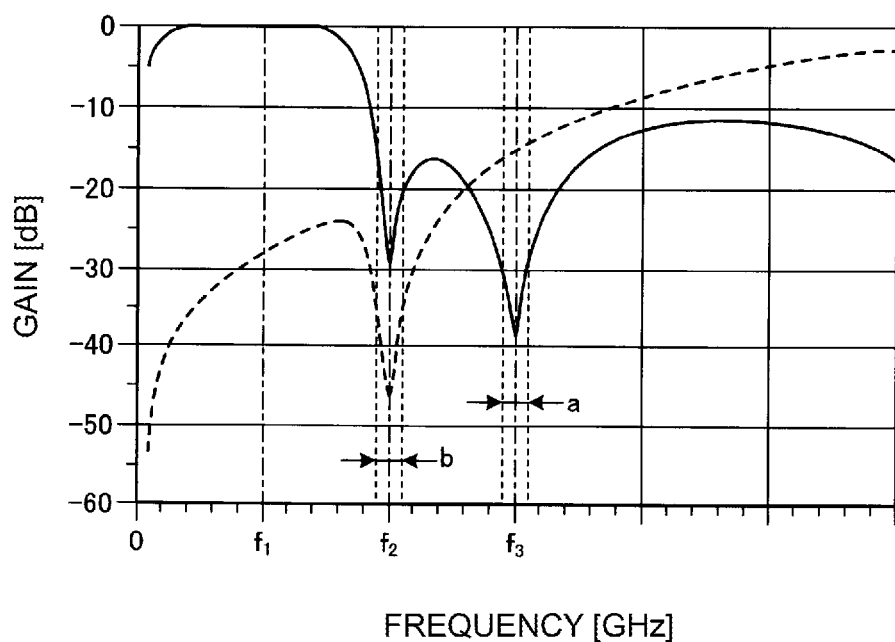
FIG. 6 illustrates an example of a bandpass characteristic in the example of the configuration illustrated in FIG. 1.

FIG. 4 illustrates an example of a configuration of a power amplifier circuit according to a comparative example. FIG. 5 illustrates an example of a bandpass characteristic in the comparative example illustrated in FIG. 4. FIG. 6 illustrates an example of a bandpass characteristic in the example of the configuration illustrated in FIG. 1.

The power amplifier circuit according to the comparative example illustrated in FIG. 4 differs from the power amplifier circuit 1 according to the first embodiment illustrated in FIG. 1 in that the power amplifier circuit according to the comparative example does not include the first LC series resonant circuit 7 and the second LC series resonant circuit 8.

In the examples illustrated in FIGS. 5 and 6, the horizontal axis represents frequency, and the vertical axis represents gain. A solid line illustrated in FIG. 6 represents a bandpass characteristic of a network through which a differential output of the differential amplifier 4 is transmitted to the output node 3 in the configuration according to the first embodiment illustrated in FIG. 1. A dashed line illustrated in FIG. 6 represents a bandpass characteristic of the network through which an in-phase output of the differential amplifier 4 is transmitted to the output node 3 in the configuration according to the first embodiment illustrated in FIG. 1. A solid line illustrated in FIG. 5 represents a bandpass characteristic of a network through which a differential output of the differential amplifier 4 is transmitted to the output node 3 in the configuration according to the comparative example illustrated in FIG. 4. A dashed line illustrated in FIG. 5 represents a bandpass characteristic of the network through which an in-phase output of the differential amplifier 4 is transmitted to the output node 3 in the configuration according to the comparative example illustrated in FIG. 4.

Furthermore, a symbol "$f_1$" illustrated in FIGS. 5 and 6 represents a frequency of a fundamental of a high-frequency signal. A symbol "$f_2$" illustrated in FIGS. 5 and 6 represents a frequency of a second harmonic of the high-frequency signal. A symbol "$f_3$" illustrated in FIGS. 5 and 6 represents a frequency of a third harmonic of the high-frequency signal.

In the configuration of the power amplifier circuit according to the comparative example illustrated in FIG. 4, a combination of the differential amplifier 4 and the second transformer 6 makes it possible to achieve output matching over a wide frequency band. As illustrated in FIG. 5, this makes it possible to achieve a wide bandpass characteristic in a frequency band including the fundamental.

Although, in the configuration of the power amplifier circuit according to the comparative example illustrated in FIG. 4, a wide bandpass characteristic is achieved, a harmonic caused by the nonlinearity of the transistors $Tr_{41}$ and $Tr_{42}$ constituting the differential amplifier 4 tends to be output.

In the power amplifier circuit 1 according to the first embodiment, with respect to the matching network 100, the first LC series resonant circuit 7 is connected in parallel with the input-side winding 61 of the second transformer 6. Furthermore, in the power amplifier circuit 1 according to the first embodiment, with respect to the matching network 100, the second LC series resonant circuit 8 is connected in parallel with the output-side winding 62 of the second transformer 6. Resonant frequencies of the first LC series resonant circuit 7 and the second LC series resonant circuit 8 are caused to coincide with the frequency of any harmonic of a plurality of harmonics, thereby making it possible to suppress a harmonic output from the power amplifier circuit 1. An example of setting of resonant frequencies of the first LC series resonant circuit 7 and the second LC series resonant circuit 8 will be described below.

In the power amplifier circuit 1 according to the first embodiment, the differential amplifier 4 is used, and thus a load impedance seen from the differential amplifier 4 is open-circuited at even harmonics including the second harmonic. Thus, in terms of the highly efficient operation of the differential amplifier 4, it is desirable that a resonant frequency of the first LC series resonant circuit 7 is caused to coincide with the frequency of a harmonic other than even harmonics, that is, the frequency of an odd harmonic.

A resonant frequency $f_{LC1}$ of the first LC series resonant circuit 7 is represented by the following equation (1).

$$f_{LC1} = \frac{1}{2\pi\sqrt{L_1 C_1}} \quad (1)$$

The resonant frequency $f_{LC1}$ of the first LC series resonant circuit 7 is set in a first frequency band a including the third harmonic, for example, (see FIG. 6). Specifically, it is desirable that the frequency range of the first frequency band a is not less than about 0.85 times and not more than about 1.15 times the frequency $f_3$ of the third harmonic. Thus, as illustrated in FIG. 6, the matching network 100 according to the first embodiment can suppress the third harmonic in the bandpass characteristic of the network through which a differential output of the differential amplifier 4 is transmitted to the output node 3.

At this time, it is desirable that the capacitor $C_1$ and the inductor $L_1$ are determined so that the resonant frequency $f_{LC1}$ of the first LC series resonant circuit 7 coincides with the frequency $f_3$ of the third harmonic. This makes it possible to more effectively suppress the third harmonic in the bandpass characteristic of the network through which a differential output of the differential amplifier 4 is transmitted to the output node 3.

Furthermore, at this time, the load impedance seen from the differential amplifier 4 is open-circuited at even harmonics including the second harmonic by the differential operation of the differential amplifier 4 as described above and is short-circuited at the third harmonic by the first LC series resonant circuit 7. Thus, the differential amplifier 4 performs inverse class-F operation, thereby enabling highly efficient operation.

Furthermore, a resonant frequency $f_{LC2}$ of the second LC series resonant circuit 8 is represented by the following equation (2).

$$f_{LC2} = \frac{1}{2\pi\sqrt{L_2 C_2}} \quad (2)$$

The resonant frequency $f_{LC2}$ of the second LC series resonant circuit 8 is set in a second frequency band b including the second harmonic, for example, (see FIG. 6). Specifically, it is desirable that the frequency range of the second frequency band b is not less than about 0.85 times and not more than about 1.15 times the frequency $f_2$ of the second harmonic. Thus, as illustrated in FIG. 6, the matching network 100 according to the first embodiment can suppress the second harmonic in the bandpass characteristic of the network through which a differential output of the differential amplifier 4 is transmitted to the output node 3 and in the bandpass characteristic of the network through which an in-phase output of the differential amplifier 4 is transmitted to the output node 3.

At this time, it is desirable that the capacitor $C_2$ and the inductor $L_2$ are determined so that the resonant frequency $f_{LC2}$ of the second LC series resonant circuit 8 coincides with the frequency $f_2$ of the second harmonic. This makes it possible to more effectively suppress the second harmonic in the bandpass characteristic of the network through which a differential output of the differential amplifier 4 is transmitted to the output node 3 and in the bandpass characteristic of the network through which an in-phase output of the differential amplifier 4 is transmitted to the output node 3.

Note that the resonant frequency $f_{LC1}$ of the first LC series resonant circuit 7 and the resonant frequency $f_{LC2}$ of the second LC series resonant circuit 8 are not to be limited to the above-described examples and are to be appropriately determined in accordance with a level of each harmonic generated in the power amplifier circuit 1.

For example, the resonant frequency $f_{LC1}$ of the first LC series resonant circuit 7 may be set in a first frequency band including any one of odd harmonics of fifth and higher orders. The resonant frequency $f_{LC2}$ of the second LC series resonant circuit 8 may be set in a second frequency band including any one of harmonics of third and higher orders.

Furthermore, for example, the resonant frequency $f_{LC1}$ of the first LC series resonant circuit 7 and the resonant frequency $f_{LC2}$ of the second LC series resonant circuit 8 may be set so that the same harmonic is suppressed. In this case, the first frequency band and the second frequency band may be the same frequency band.

Second Embodiment

Figure 7:
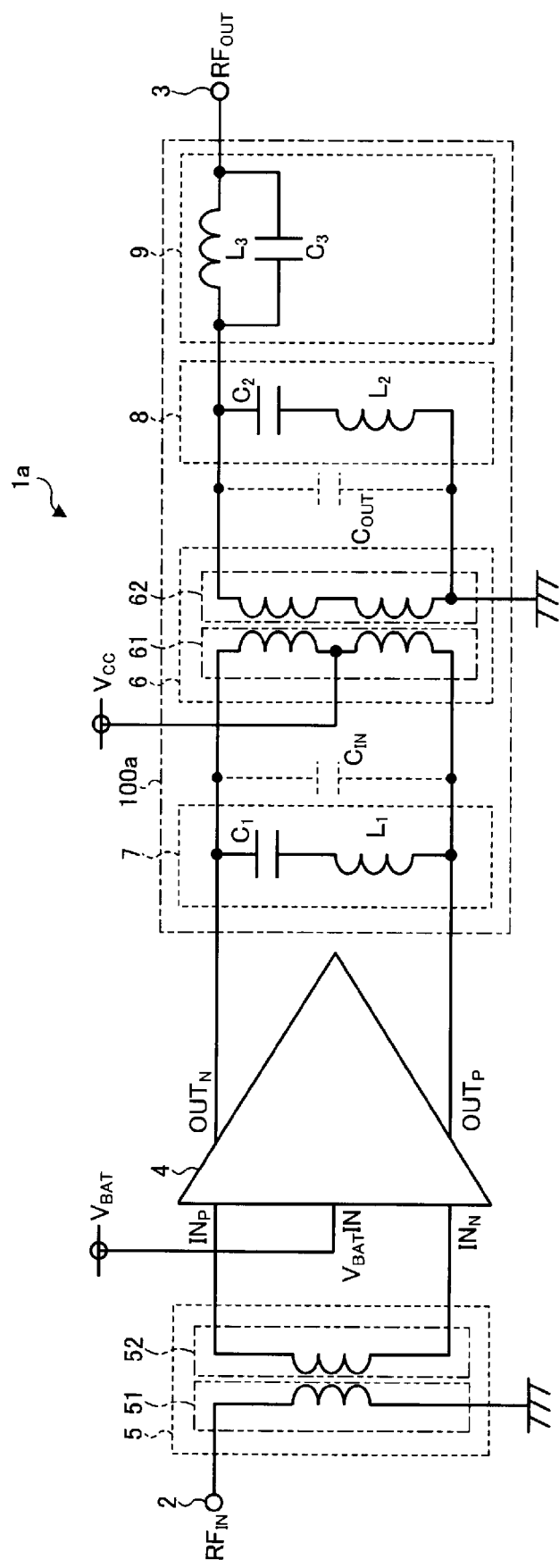
FIG. 7 illustrates an example of a configuration of a power amplifier circuit according to a second embodiment.

FIG. 7 illustrates an example of a configuration of a power amplifier circuit according to a second embodiment. Components that are the same as those in the first embodiment are denoted by the same reference numerals, and description thereof is omitted.

In contrast to the power amplifier circuit 1 according to the first embodiment, a power amplifier circuit 1a according to the second embodiment further includes, as a matching network 100a, an LC parallel resonant circuit 9 in addition to the first LC series resonant circuit 7 and the second LC series resonant circuit 8.

The LC parallel resonant circuit 9 includes a capacitor $C_3$ serving as a capacitive element, and an inductor $L_3$ serving as an inductive element.

The LC parallel resonant circuit 9 is constituted by the capacitor $C_3$ and the inductor $L_3$ that are connected in parallel with each other between the other end of the output-side winding 62 of the second transformer 6 and the output node 3.

Figure 8:
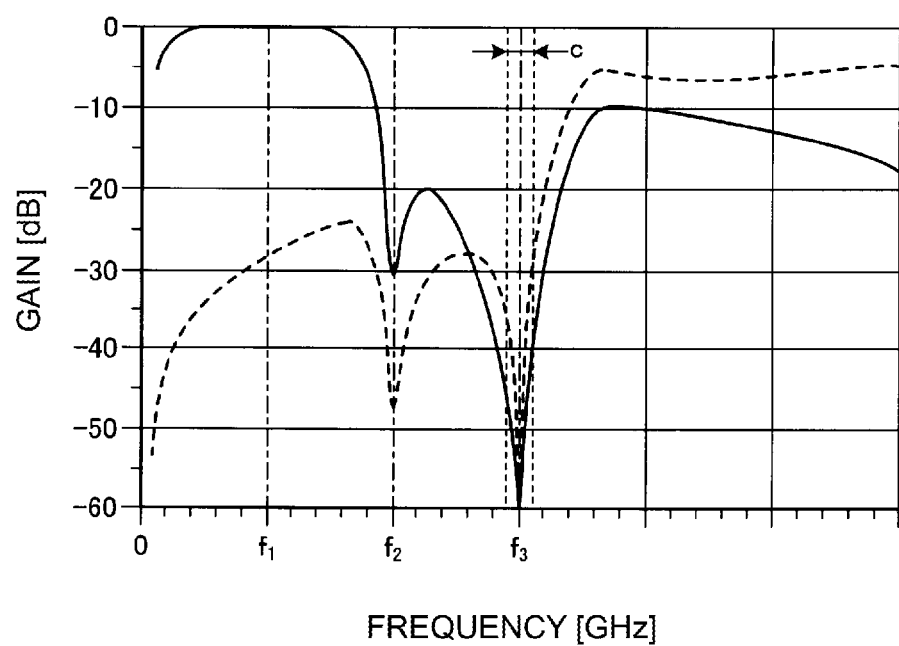
FIG. 8 illustrates an example of a bandpass characteristic in the example of the configuration illustrated in FIG. 7.

FIG. 8 illustrates an example of a bandpass characteristic in the example of the configuration illustrated in FIG. 7.

In the example illustrated in FIG. 8, the horizontal axis represents frequency, and the vertical axis represents gain. A solid line illustrated in FIG. 8 represents a bandpass characteristic of a network through which a differential output of the differential amplifier 4 is transmitted to the output node 3 in the configuration according to the second embodiment illustrated in FIG. 7. A dashed line illustrated in FIG. 8 represents a bandpass characteristic of the network through which an in-phase output of the differential amplifier 4 is transmitted to the output node 3 in the configuration according to the second embodiment illustrated in FIG. 7.

Furthermore, a symbol "$f_1$" illustrated in FIG. 8 represents a frequency of a fundamental of a high-frequency signal. A symbol "$f_2$" illustrated in FIG. 8 represents a frequency of a second harmonic of the high-frequency signal. A symbol "$f_3$" illustrated in FIG. 8 represents a frequency of a third harmonic of the high-frequency signal.

A resonant frequency $f_{LC3}$ of the LC parallel resonant circuit 9 is represented by the following equation (3).

$$f_{LC3} = \frac{1}{2\pi\sqrt{L_3 C_3}} \quad (3)$$

The resonant frequency $f_{LC3}$ of the LC parallel resonant circuit 9 is set in a third frequency band c including the third harmonic, for example, (see FIG. 8). Specifically, it is desirable that the frequency range of the third frequency band c is not less than about 0.85 times and not more than about 1.15 times the frequency $f_3$ of the third harmonic. Thus, as illustrated in FIG. 8, the matching network 100a according to the second embodiment can suppress, in comparison with the first embodiment, the third harmonic in the bandpass characteristic of the network through which a differential output of the differential amplifier 4 is transmitted to the output node 3 and in the bandpass characteristic of the network through which an in-phase output of the differential amplifier 4 is transmitted to the output node 3.

At this time, it is desirable that the capacitor $C_3$ and the inductor $L_3$ are determined so that the resonant frequency $f_{LC3}$ of the LC parallel resonant circuit 9 coincides with the frequency $f_3$ of the third harmonic. This makes it possible to still more effectively suppress the third harmonic in the bandpass characteristic of the network through which a differential output of the differential amplifier 4 is transmitted to the output node 3 and in the bandpass characteristic of the network through which an in-phase output of the differential amplifier 4 is transmitted to the output node 3.

Note that the resonant frequency $f_{LC3}$ of the LC parallel resonant circuit 9 is not to be limited to the above-described example and is to be appropriately determined in accordance with a level of each harmonic generated in the power amplifier circuit 1a.

For example, the resonant frequency $f_{LC3}$ of the LC parallel resonant circuit 9 may be set in a third frequency band including any one of harmonics of second or fourth and higher orders.

Furthermore, for example, the resonant frequency $f_{LC3}$ of the LC parallel resonant circuit 9 may be set so that a harmonic with the same frequency as the resonant frequency $f_{LC1}$ of the first LC series resonant circuit 7 or the resonant frequency $f_{LC2}$ of the second LC series resonant circuit 8 is suppressed. In this case, the third frequency band may be the same as the first frequency band or the second frequency band.

Third Embodiment

Figure 9:
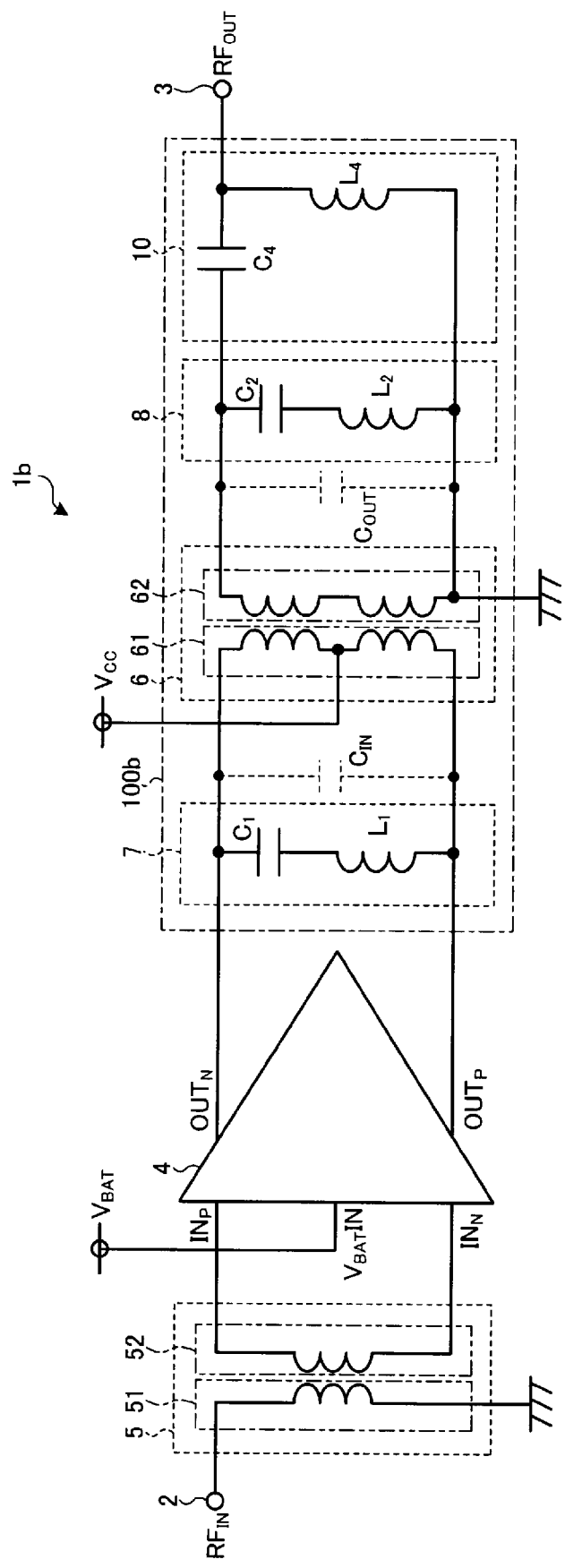
FIG. 9 illustrates an example of a configuration of a power amplifier circuit according to a third embodiment.

FIG. 9 illustrates an example of a configuration of a power amplifier circuit according to a third embodiment. Components that are the same as those in the first embodiment are denoted by the same reference numerals, and description thereof is omitted.

In contrast to the power amplifier circuit 1 according to the first embodiment, a power amplifier circuit 1b according to the third embodiment further includes, as a matching network 100b, an LC high pass filter circuit 10 in addition to the first LC series resonant circuit 7 and the second LC series resonant circuit 8.

The LC high pass filter circuit 10 includes a capacitor $C_4$ serving as a capacitive element, and an inductor $L_4$ serving as an inductive element.

The LC high pass filter circuit 10 is constituted by the capacitor $C_4$ connected between the other end of the output-side winding 62 of the second transformer 6 and the output node 3, and the inductor $L_4$ connected between the output node 3 and the reference potential.

Figure 10:
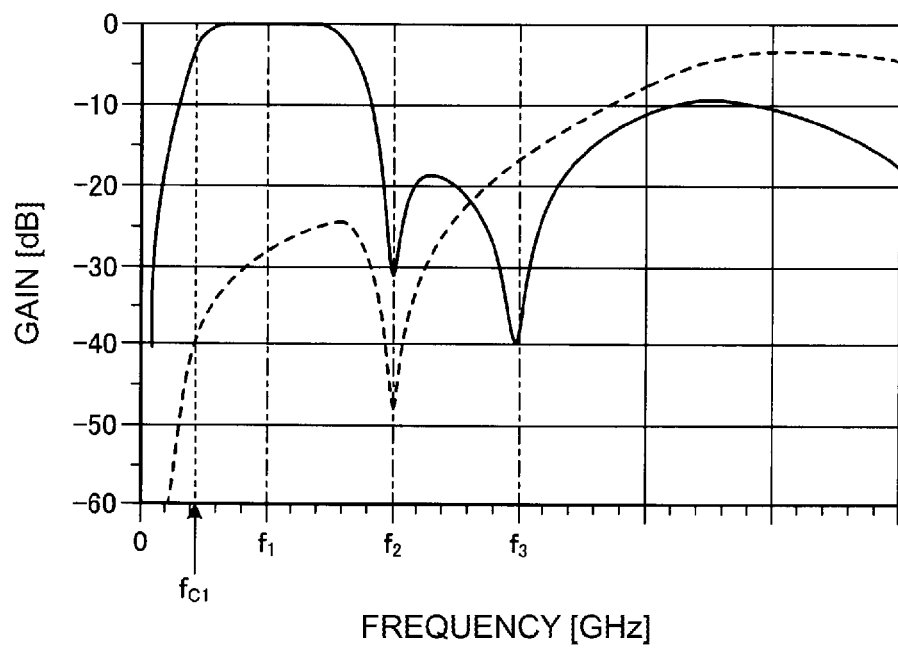
FIG. 10 illustrates an example of a bandpass characteristic in the example of the configuration illustrated in FIG. 9.

FIG. 10 illustrates an example of a bandpass characteristic in the example of the configuration illustrated in FIG. 9.

In the example illustrated in FIG. 10, the horizontal axis represents frequency, and the vertical axis represents gain. A solid line illustrated in FIG. 10 represents a bandpass characteristic of a network through which a differential output of the differential amplifier 4 is transmitted to the output node 3 in the configuration according to the third embodiment illustrated in FIG. 9. A dashed line illustrated in FIG. 10 represents a bandpass characteristic of the network through which an in-phase output of the differential amplifier 4 is transmitted to the output node 3 in the configuration according to the third embodiment illustrated in FIG. 9.

Furthermore, a symbol "$f_1$" illustrated in FIG. 10 represents a frequency of a fundamental of a high-frequency signal. A symbol "$f_2$" illustrated in FIG. 10 represents a frequency of a second harmonic of the high-frequency signal. A symbol "$f_3$" illustrated in FIG. 10 represents a frequency of a third harmonic of the high-frequency signal.

A cutoff frequency $f_{C2}$ of the LC high pass filter circuit 10 is represented by the following equation (4).

$$f_{C1} = \frac{1}{2\pi\sqrt{L_4 C_4}} \quad (4)$$

The cutoff frequency $f_{C1}$ of the LC high pass filter circuit 10 is set in a frequency band lower than the fundamental of the high-frequency signal (see FIG. 10). Thus, as illustrated in FIG. 10, the matching network 100b according to the third embodiment can suppress low-frequency oscillation generated through a power-supply loop or the like without necessarily attenuating the fundamental of the high-frequency signal in the bandpass characteristic of the network through which a differential output of the differential amplifier 4 is transmitted to the output node 3.

Fourth Embodiment

Figure 11:
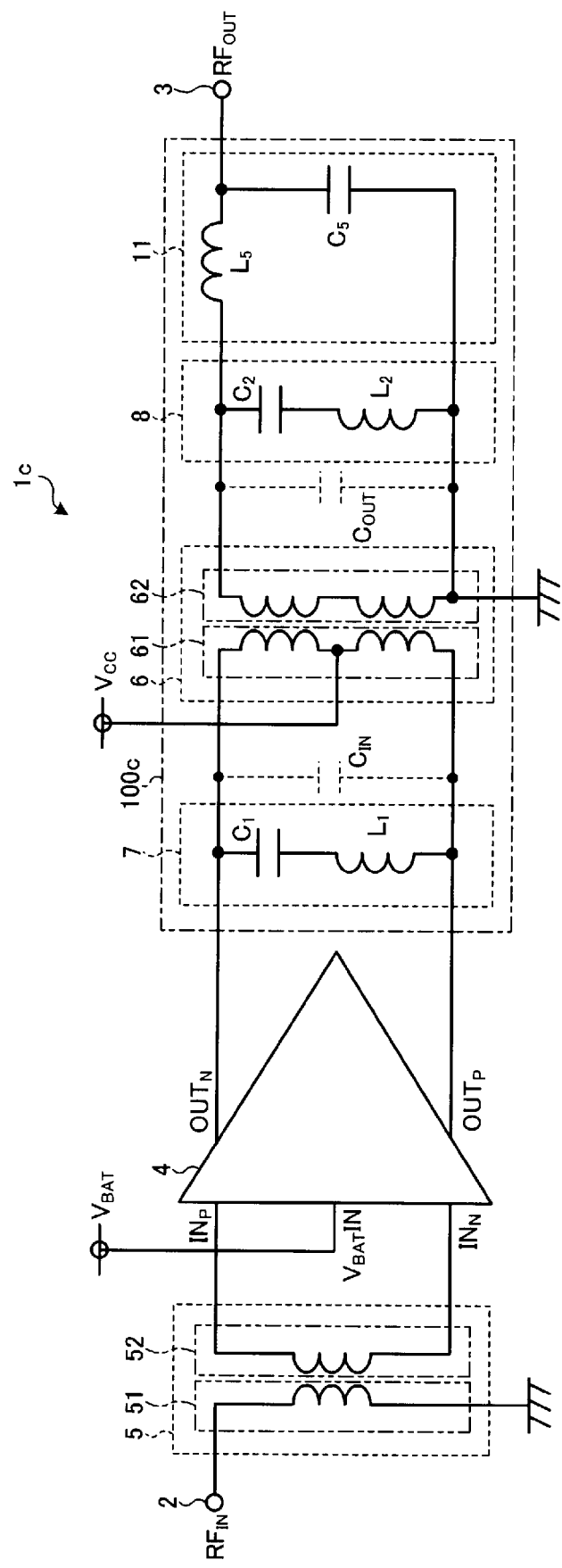
FIG. 11 illustrates an example of a configuration of a power amplifier circuit according to a fourth embodiment.

FIG. 11 illustrates an example of a configuration of a power amplifier circuit according to a fourth embodiment. Components that are the same as those in the first embodiment are denoted by the same reference numerals, and description thereof is omitted.

In contrast to the power amplifier circuit 1 according to the first embodiment, a power amplifier circuit 1c according to the fourth embodiment further includes, as a matching network 100c, an LC low pass filter circuit 11 in addition to the first LC series resonant circuit 7 and the second LC series resonant circuit 8.

The LC low pass filter circuit 11 includes an inductor $L_5$ serving as an inductive element, and a capacitor $C_5$ serving as a capacitive element.

The LC low pass filter circuit 11 is constituted by the inductor $L_5$ connected between the other end of the output-side winding 62 of the second transformer 6 and the output node 3, and the capacitor $C_5$ connected between the output node 3 and the reference potential.

Figure 12:
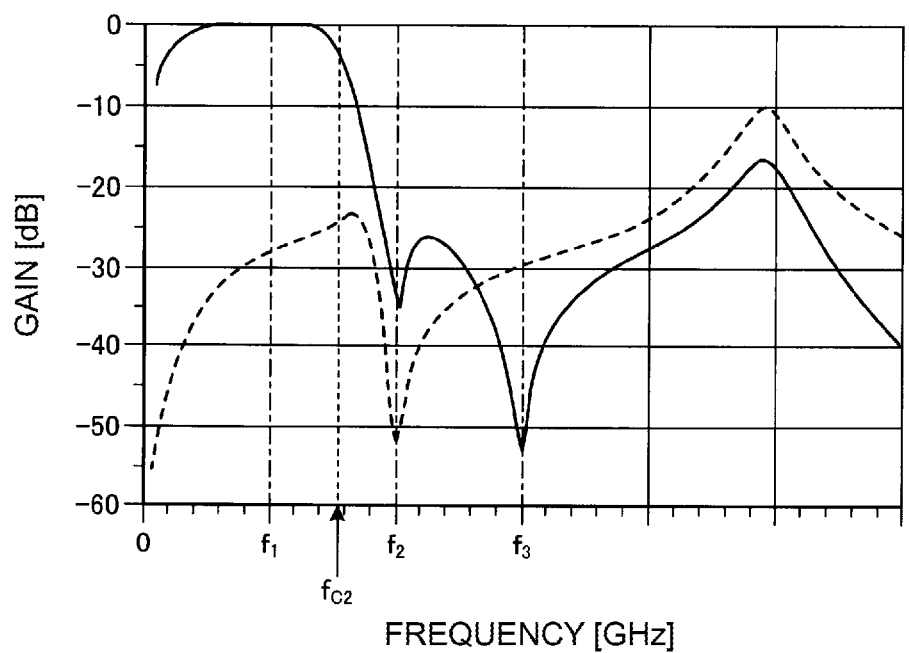
FIG. 12 illustrates an example of a bandpass characteristic in the example of the configuration illustrated in FIG. 11.

FIG. 12 illustrates an example of a bandpass characteristic in the example of the configuration illustrated in FIG. 11.

In the example illustrated in FIG. 12, the horizontal axis represents frequency, and the vertical axis represents gain. A solid line illustrated in FIG. 12 represents a bandpass characteristic of a network through which a differential output of the differential amplifier 4 is transmitted to the output node 3 in the configuration according to the fourth embodiment illustrated in FIG. 11. A dashed line illustrated in FIG. 12 represents a bandpass characteristic of the network through which an in-phase output of the differential amplifier 4 is transmitted to the output node 3 in the configuration according to the fourth embodiment illustrated in FIG. 11.

Furthermore, a symbol "$f_1$" illustrated in FIG. 12 represents a frequency of a fundamental of a high-frequency signal. A symbol "$f_2$" illustrated in FIG. 12 represents a frequency of a second harmonic of the high-frequency signal. A symbol "$f_3$" illustrated in FIG. 12 represents a frequency of a third harmonic of the high-frequency signal.

A cutoff frequency $f_{C2}$ of the LC low pass filter circuit 11 is represented by the following equation (5).

$$f_{C2} = \frac{1}{2\pi\sqrt{L_5 C_5}} \quad (5)$$

The cutoff frequency $f_{C2}$ of the LC low pass filter circuit 11 is set in a frequency band higher than the fundamental of the high-frequency signal (see FIG. 12). Thus, as illustrated in FIG. 12, the matching network 100c according to the fourth embodiment can suppress, in comparison with the first embodiment, the second harmonic, the third harmonic, and so forth without necessarily attenuating the fundamental of the high-frequency signal in the bandpass characteristic of the network through which a differential output of the differential amplifier 4 is transmitted to the output node 3.

Fifth Embodiment

Figure 13:
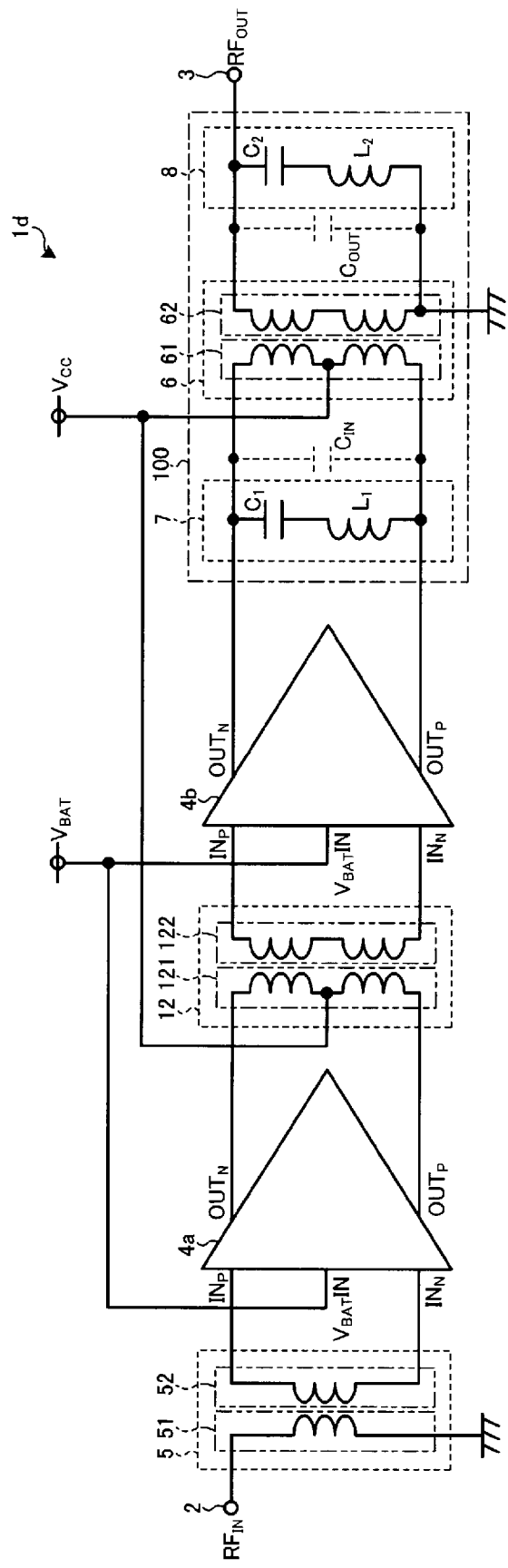
FIG. 13 illustrates an example of a configuration of a power amplifier circuit according to a fifth embodiment.

FIG. 13 illustrates an example of a configuration of a power amplifier circuit according to a fifth embodiment. Components that are the same as those in the first embodiment are denoted by the same reference numerals, and description thereof is omitted.

A power amplifier circuit 1d according to the fifth embodiment differs from the power amplifier circuit 1 according to the first embodiment in that the power amplifier circuit 1d has a two-stage configuration composed of differential amplifiers 4a and 4b.

In the power amplifier circuit 1d according to the fifth embodiment, a third transformer 12 is provided between the first-stage differential amplifier 4a and the second-stage differential amplifier 4b.

A configuration of the first-stage differential amplifier 4a or a configuration of the second-stage differential amplifier 4b may be the same as the configuration of the differential amplifier 4 according to the first to fourth embodiments or may differ from the configuration of the differential amplifier 4.

The third transformer 12 constitutes an interstage matching network between an output of the first-stage differential amplifier 4a and an input of the second-stage differential amplifier 4b.

The third transformer 12 includes an input-side winding 121 and an output-side winding 122.

The input-side winding 121 is connected between an output $OUT_N$ and an output OUT of the differential amplifier 4a. A midpoint of the input-side winding 121 is connected to the power-supply potential $V_{CC}$.

The output-side winding 122 is connected between an input IN and an input $IN_N$ of the differential amplifier 4b.

The input-side winding 121 and the output-side winding 122 are coupled via an electromagnetic field. Thus, a differential signal output from the differential amplifier 4a and input to the input-side winding 121 is subjected to electromagnetic induction by the third transformer 12 and is output to the differential amplifier 4b.

Thus, the two-stage configuration composed of the differential amplifiers 4a and 4b enables higher output power than the configuration according to the first to fourth embodiments.

Furthermore, for example, the differential amplifier 4a and the differential amplifier 4b are respectively caused to serve as a drive-stage amplifier and a power-stage amplifier to have respective different gains, or alternatively one of the differential amplifiers 4a and 4b is caused to have a variable gain, and thus versatility is increased.

Note that, when a differential amplifier is divided into multiple stages, the number of stages is not limited to two as described above, and a multi-stage configuration composed of three or more stages can be employed. In this case, a plurality of differential amplifiers are connected to each other via the third transformer 12 to form multiple stages. This enables much higher output power than the two-stage configuration illustrated in FIG. 13.

Furthermore, although, in the fifth embodiment, the example has been described in which the differential amplifier is divided into multiple stages in the configuration in which the matching network 100 is included, the differential amplifier can be divided into multiple stages in the configuration in which the matching network 100a, 100b, or 100c is included.

In the above-described power amplifier circuits 1, 1a, 1b, 1c, and 1d according to the first to fifth embodiments, at least the differential amplifier 4 or at least the differential amplifiers 4a and 4b, at least the first and second transformers 5 and 6 and/or at least the third transformer 12, and at least the matching network 100, 100a, 100b, or 100c are mounted on the same semiconductor chip, thereby enabling a reduction in the size or cost of each of the power amplifier circuits 1, 1a, 1b, 1c, and 1d.

The above-described embodiments are intended to facilitate understanding of the present disclosure but are not intended for a limited interpretation of the present disclosure. The present disclosure can be changed or improved without necessarily departing from the gist thereof and includes equivalents thereof.

Furthermore, the present disclosure can take the following configurations.

(1) A matching network according to one embodiment of the present disclosure is a matching network of a power amplifier circuit to which a high-frequency signal is input from an input node and that outputs, to an output node, a signal obtained by a differential amplifier amplifying power of the high-frequency signal. The matching network includes an input-side winding connected between differential outputs of the differential amplifier; an output-side winding that is coupled to the input-side winding via an electromagnetic field and whose one end is connected to a reference potential; a first LC series resonant circuit including a capacitive element and an inductive element connected in series with each other, and being connected in parallel with the input-side winding; and a second LC series resonant circuit including a capacitive element and an inductive element connected in series with each other, and being connected in parallel with the output-side winding.

In this configuration, resonant frequencies of the first LC series resonant circuit and the second LC series resonant circuit are caused to coincide with the frequency of any harmonic of a plurality of harmonics, and thus the matching network can effectively suppress a harmonic output from the power amplifier circuit.

(2) In the matching network in the above (1), a resonant frequency of the first LC series resonant circuit may be set in a first frequency band including any one of odd harmonics of a plurality of harmonics included in the high-frequency signal, and a resonant frequency of the second LC series resonant circuit may be set in a second frequency band including any one of the harmonics.

In this configuration, the first LC series resonant circuit attenuates any one of the odd harmonics, and the second LC series resonant circuit attenuates any one of the harmonics. Thus, the matching network can inhibit any one of the odd harmonics and any one of the harmonics from being output from the power amplifier circuit.

(3) In the matching network in the above (1), a resonant frequency of the first LC series resonant circuit may be set in a first frequency band including a third harmonic.

In this configuration, the first LC series resonant circuit attenuates the third harmonic. Thus, the matching network can inhibit the third harmonic from being output from the power amplifier circuit. Furthermore, a load impedance seen from the differential amplifier is open-circuited at even harmonics including a second harmonic by the differential operation of the differential amplifier and is short-circuited at the third harmonic by the first LC series resonant circuit. Thus, the differential amplifier performs inverse class-F operation, thereby enabling highly efficient operation.

(4) In the matching network in the above (1) or (3), a resonant frequency of the second LC series resonant circuit may be set in a second frequency band including a second harmonic.

In this configuration, the second LC series resonant circuit attenuates the second harmonic. Thus, the matching network can inhibit the second harmonic from being output from the power amplifier circuit.

(5) The matching network in any of the above (1) to (4) may further include an LC parallel resonant circuit including a capacitive element and an inductive element connected in parallel with each other between another end of the output-side winding and the output node.

In this configuration, a resonant frequency of the LC parallel resonant circuit is caused to coincide with the frequency of any harmonic of a plurality of harmonics, and thus the matching network can more effectively suppress a harmonic output from the power amplifier circuit.

(6) In the matching network in the above (5), a resonant frequency of the LC parallel resonant circuit may be set in a third frequency band including any one of a plurality of harmonics included in the high-frequency signal.

In this configuration, the LC parallel resonant circuit attenuates any one of the plurality of harmonics. Thus, the matching network can inhibit any one of the plurality of harmonics from being output from the power amplifier circuit.

(7) In the matching network in the above (5), a resonant frequency of the LC parallel resonant circuit may be set in a third frequency band including a third harmonic.

In this configuration, the LC parallel resonant circuit attenuates the third harmonic. Thus, the matching network can still more effectively inhibit the third harmonic from being output from the power amplifier circuit.

(8) The matching network in any of the above (1) to (4) may further include an LC high pass filter circuit including a capacitive element connected between another end of the output-side winding and the output node, and an inductive element connected between the output node and the reference potential.

In this configuration, the LC high pass filter circuit attenuates a frequency band not higher than a cutoff frequency. Thus, the matching network can suppress low-frequency oscillation generated through a power-supply loop or the like in the power amplifier circuit.

(9) In the matching network in the above (8), a cutoff frequency of the LC high pass filter circuit may be set in a frequency band lower than a fundamental of the high-frequency signal.

In this configuration, the LC high pass filter circuit attenuates a frequency band lower than the fundamental of the high-frequency signal. Thus, the matching network can suppress low-frequency oscillation generated through the power-supply loop or the like in the power amplifier circuit without necessarily attenuating the fundamental of the high-frequency signal.

(10) The matching network in any of the above (1) to (4) may further include an LC low pass filter circuit including an inductive element connected between another end of the output-side winding and the output node, and a capacitive element connected between the output node and the reference potential.

In this configuration, the LC low pass filter circuit attenuates a frequency band not less than a cutoff frequency. Thus, the matching network can inhibit a harmonic with a frequency not less than the cutoff frequency from being output from the power amplifier circuit.

(11) In the matching network in the above (10), a cutoff frequency of the LC low pass filter circuit may be set in a frequency band higher than a fundamental of the high-frequency signal.

In this configuration, the LC low pass filter circuit attenuates a frequency band higher than the fundamental of the high-frequency signal. Thus, the matching network can inhibit a harmonic with a frequency not less than the cutoff frequency from being output from the power amplifier circuit without necessarily attenuating the fundamental of the high-frequency signal.

(12) A power amplifier circuit according to one embodiment of the present disclosure includes the matching network in any of the above (1) to (11).

In this configuration, the power amplifier circuit can inhibit a harmonic from being output.

(13) In the power amplifier circuit in the above (12), a plurality of the differential amplifiers may be connected to each other via a transformer to form multiple stages.

This configuration enables higher output power of the power amplifier circuit.

(14) In the power amplifier circuit in the above (12) or (13), at least the differential amplifier and at least the matching network may be mounted on an identical semiconductor chip.

This configuration enables a reduction in the size or cost of the power amplifier circuit.

The present disclosure makes it possible to suppress a harmonic output from the power amplifier circuit.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A matching network of a power amplifier circuit that receives, at an input node, a high-frequency signal and that outputs, to an output node, a signal obtained by amplifying a power of the high-frequency signal with a differential amplifier, the matching network comprising:
an input-side winding connected between differential outputs of the differential amplifier;
an output-side winding that is coupled to the input-side winding via an electromagnetic field, wherein a first end of the output-side winding is connected to a reference potential;
a first LC series resonant circuit connected in parallel with the input-side winding, the first LC series resonant circuit comprising a first capacitive element and a first inductive element connected in series with each other; and
a second LC series resonant circuit connected in parallel with the output-side winding, the second LC series resonant circuit comprising a second capacitive element and a second inductive element connected in series with each other.

2. The matching network according to claim 1,
wherein a resonant frequency of the first LC series resonant circuit is in a first frequency band comprising an odd harmonic of the high-frequency signal,
wherein a resonant frequency of the second LC series resonant circuit is in a second frequency band comprising another harmonic of the high-frequency signal, and
wherein the first frequency band and the second frequency band do not overlap.

3. The matching network according to claim 1,
wherein a resonant frequency of the first LC series resonant circuit is in a first frequency band comprising a third harmonic of the high-frequency signal, and
wherein a lower limit of the first frequency band is not less than 0.85 times a frequency of the third harmonic and an upper limit of the first frequency band is not more than 1.15 times the frequency of the third harmonic.

4. The matching network according to claim 1,
wherein a resonant frequency of the second LC series resonant circuit is in a second frequency band comprising a second harmonic of the high-frequency signal, and
wherein a lower limit of the second frequency band is not less than 0.85 times a frequency of the second harmonic and an upper limit of the second frequency band is not more than 1.15 times the frequency of the second harmonic.

5. The matching network according to claim 1, further comprising:
an LC parallel resonant circuit between a second end of the output-side winding and the output node,
wherein the LC parallel resonant circuit comprises a capacitive element and an inductive element connected in parallel with each other.

6. The matching network according to claim 5,
wherein a resonant frequency of the LC parallel resonant circuit is in a third frequency band comprising an harmonic of the high-frequency signal, and
wherein a lower limit of the third frequency band is not less than 0.85 times a frequency of the harmonic and an upper limit of the third frequency band is not more than 1.15 times the frequency of the harmonic.

7. The matching network according to claim 5,
wherein a resonant frequency of the LC parallel resonant circuit is in a third frequency band comprising a third harmonic of the high-frequency signal,
wherein a lower limit of the third frequency band is not less than 0.85 times a frequency of the third harmonic and an upper limit of the third frequency band is not more than 1.15 times the third frequency of the harmonic.

8. The matching network according to claim 1, further comprising:
an LC high pass filter circuit connected between the output node and the reference potential,
wherein the LC high pass filter comprises a capacitive element connected between a second end of the output-side winding and the output node, and an inductive element.

9. The matching network according to claim 8, wherein the inductive element is connected between the output node and the reference potential.

10. The matching network according to claim 8, wherein a cutoff frequency of the LC high pass filter circuit is in a frequency band lower than a fundamental of the high-frequency signal.

11. The matching network according to claim 1, further comprising:
an LC low pass filter circuit connected between the output node and the reference potential,
wherein the LC low pass filter comprises an inductive element connected between a second end of the output-side winding and the output node, and a capacitive element.

12. The matching network according to claim 11, wherein the capacitive element is connected between the output node and the reference potential.

13. The matching network according to claim 11, wherein a cutoff frequency of the LC low pass filter circuit is in a frequency band higher than a fundamental of the high-frequency signal.

14. A power amplifier circuit comprising:
the matching network according to claim 1.

15. The power amplifier circuit according to claim 14, comprising a plurality of the differential amplifiers connected to each other via transformers to form multiple power amplification stages.

16. The power amplifier circuit according to claim 14, wherein the differential amplifier and the matching network are mounted on a same semiconductor chip.

17. The matching network according to claim 2, further comprising:
an LC parallel resonant circuit between a second end of the output-side winding and the output node,
wherein the LC parallel resonant circuit comprises a capacitive element and an inductive element connected in parallel with each other.

18. The matching network according to claim 3, further comprising:
an LC parallel resonant circuit between a second end of the output-side winding and the output node,
wherein the LC parallel resonant circuit comprises a capacitive element and an inductive element connected in parallel with each other.

19. The matching network according to claim 4, further comprising:
an LC parallel resonant circuit between a second end of the output-side winding and the output node,
wherein the LC parallel resonant circuit comprises a capacitive element and an inductive element connected in parallel with each other.

* * * * *

UNITED STATES PATENT AND TRADEMARK OFFICE
CERTIFICATE OF CORRECTION

| | |
|---|---|
| PATENT NO. | : 10,797,657 B2 |
| APPLICATION NO. | : 16/217506 |
| DATED | : October 6, 2020 |
| INVENTOR(S) | : Kiichiro Takanaka |

It is certified that error appears in the above-identified patent and that said Letters Patent is hereby corrected as shown below:

In the Specification

Column 11, Line 4, "and an output OUT of the" should read -- and an output $OUT_P$ of the --

Column 11, Line 8, ""input IN and an input" should read -- input $IN_P$ and an input --

Signed and Sealed this
Ninth Day of August, 2022

Katherine Kelly Vidal
*Director of the United States Patent and Trademark Office*